US008689623B2

(12) United States Patent
Eto et al.

(10) Patent No.: US 8,689,623 B2
(45) Date of Patent: Apr. 8, 2014

(54) FLOW SENSOR, MASS FLOW CONTROLLER, AND METHOD FOR MANUFACTURING FLOW SENSOR

(75) Inventors: Hideo Eto, Mie (JP); Makoto Saito, Mie (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 199 days.

(21) Appl. No.: 13/419,675

(22) Filed: Mar. 14, 2012

(65) Prior Publication Data

US 2013/0074593 A1    Mar. 28, 2013

(30) Foreign Application Priority Data

Sep. 22, 2011 (JP) .................. 2011-208007

(51) Int. Cl.
*G01F 1/68* (2006.01)
(52) U.S. Cl.
USPC ..................................... 73/204.11
(58) Field of Classification Search
USPC ............... 73/204.11, 204.26, 204.22, 204.25; 29/829
See application file for complete search history.

(56) References Cited

U.S. PATENT DOCUMENTS

| 6,794,981 | B2 * | 9/2004 | Padmanabhan et al. | 338/25 |
| 6,981,410 | B2 * | 1/2006 | Seki et al. | 73/204.26 |
| 7,069,779 | B2 * | 7/2006 | Zumkehr et al. | 73/204.26 |
| 7,181,963 | B2 * | 2/2007 | Bork | 73/204.26 |
| 7,331,224 | B2 * | 2/2008 | Padmanabhan et al. | 73/204.26 |
| 7,363,810 | B2 | 4/2008 | Ikeda et al. | |
| 7,603,898 | B2 * | 10/2009 | Speldrich | 73/204.26 |
| 7,654,137 | B2 | 2/2010 | Hirata et al. | |
| 8,485,031 | B2 * | 7/2013 | Speldrich et al. | 73/204.22 |
| 2005/0081621 | A1 * | 4/2005 | Zobel et al. | 73/204.26 |
| 2007/0295082 | A1 * | 12/2007 | Kilian | 73/204.26 |
| 2012/0000542 | A1 | 1/2012 | Eto et al. | |

FOREIGN PATENT DOCUMENTS

| JP | 2-259527 | 10/1990 |
| JP | 3524707 | 2/2004 |
| JP | 2005-241279 | 9/2005 |
| JP | 3754678 | 12/2005 |
| JP | 2007-212197 | 8/2007 |
| JP | 2010-69599 | 4/2010 |
| JP | 4576597 | 9/2010 |

* cited by examiner

*Primary Examiner* — Jewel V Thompson
(74) *Attorney, Agent, or Firm* — Oblon, Spivak, McClelland, Maier & Neustadt, L.L.P.

(57) ABSTRACT

According to one embodiment, a first substrate has a pair of thermosensitive films, a heater film, and a passage protective film having corrosion resistance in a passage forming region on a first main surface, and has a metal sealing film having corrosion resistance in a region other than the passage forming region. A second substrate has a groove formed in the passage forming region on a second main surface and a side wall forming portion separating other regions other than the passage forming region from the groove and protruding beyond the other regions. A fixing member fixes the first substrate to the second substrate. The side wall forming portion of the second substrate is compression bonded so that the side wall forming portion is located on the metal sealing film on the first substrate.

8 Claims, 6 Drawing Sheets

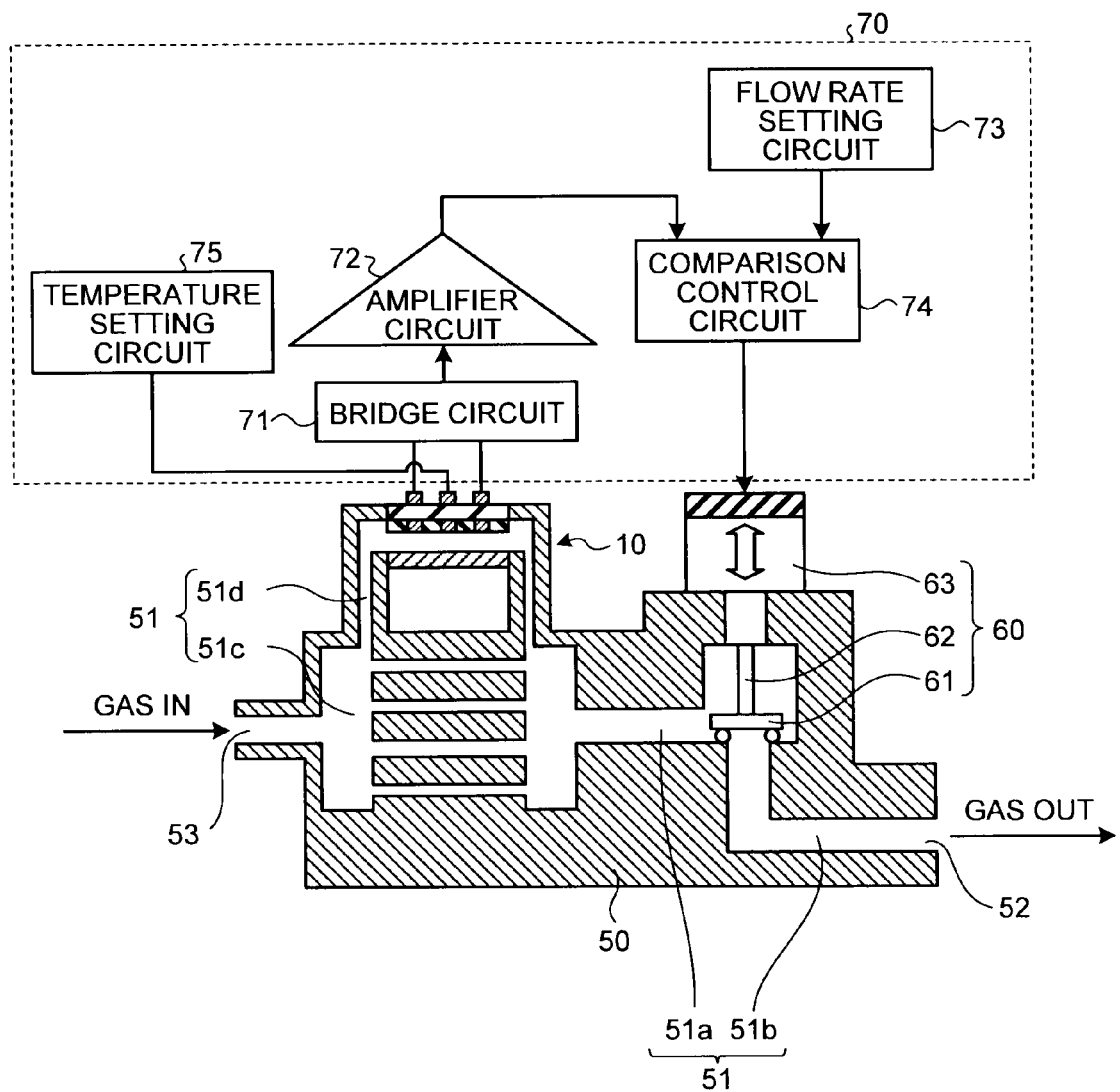

US 8,689,623 B2

FLOW SENSOR, MASS FLOW CONTROLLER, AND METHOD FOR MANUFACTURING FLOW SENSOR

CROSS-REFERENCE TO RELATED APPLICATIONS

This application is based upon and claims the benefit of priority from Japanese Patent Application No. 2011-208007, filed on Sep. 22, 2011; the entire contents of which are incorporated herein by reference.

FIELD

Embodiments described herein relate generally to a flow sensor, a mass flow controller, and a method for manufacturing a flow sensor.

BACKGROUND

In these years, there is proposed an MEMS (Micro Electro Mechanical System) sensor for a flow sensor, in which the response speed is faster than that of a coil sensor. The MEMS sensor is generally fabricated in this manner, in which a heater or a temperature sensor is formed on a semiconductor substrate made of silicon or the like by fine patterning used in the fabrication processes for semiconductor devices. However, since the MEMS sensor thus fabricated is corroded with halogen gases, it is difficult that the MEMS sensor is used in the semiconductor fabrication processes in which halogen gases are often used. Thus, an MEMS sensor usable in corrosive halogen gases is conventionally proposed.

In the case where the MEMS sensor is used in corrosive halogen gases, it is necessary that the MEMS sensor have corrosion resistance and toxic halogen gases be prevented from leaking into surroundings by enhancing sealing properties between members forming the passages of the MEMS sensor. However, in the conventional technique, there is no disclosure in terms of enhancing sealing properties in order to prevent halogen gases from leaking into surroundings.

BRIEF DESCRIPTION OF THE DRAWINGS

FIG. 4 is a cross sectional view schematically illustrating another exemplary configuration of a mass flow controller according to an embodiment.

DETAILED DESCRIPTION

In general, according to one embodiment, a flow sensor includes a first substrate, a second substrate, and a fixing member that fixes the first substrate to the second substrate. The first substrate has a pair of thermosensitive films, a heater film located on a position between the pair of thermosensitive films, and a passage protective film having corrosion resistance and provided at a position other than positions of forming the thermosensitive films and the heater film in a passage forming region on a first main surface, and the first substrate has a metal sealing film having corrosion resistance and provided in a region other than the passage forming region on the first main surface region. The second substrate has a groove formed in the passage forming region on a second main surface disposed opposite the first main surface and a side wall forming portion separating other regions other than the passage forming region from the groove and provided as protruding beyond the other regions, and the second substrate is made of a material having corrosion resistance. The fixing member bonds the first main surface to the second main surface so that the first main surface is faced to the second main surface, and fixes the first main surface to the second main surface. Moreover, the side wall forming portion of the second substrate is compression bonded so that the side wall forming portion is located on the metal sealing film of the first substrate.

In the following, a flow sensor, a mass flow controller, and a method for manufacturing a flow sensor according to an embodiment will be described in detail with reference to the accompanying drawings. It is noted that the present invention will not be limited by this embodiment. Moreover, cross sectional views illustrating the flow sensor and the mass flow controller used in the following embodiment are schematic drawings, and relations between the thickness of a layer and the width, a ratio between the thicknesses of layers, and so on are sometimes different from the actual ones. Furthermore, film thicknesses shown below are examples, and thicknesses are not limited to the shown film thicknesses.

Figure 1:
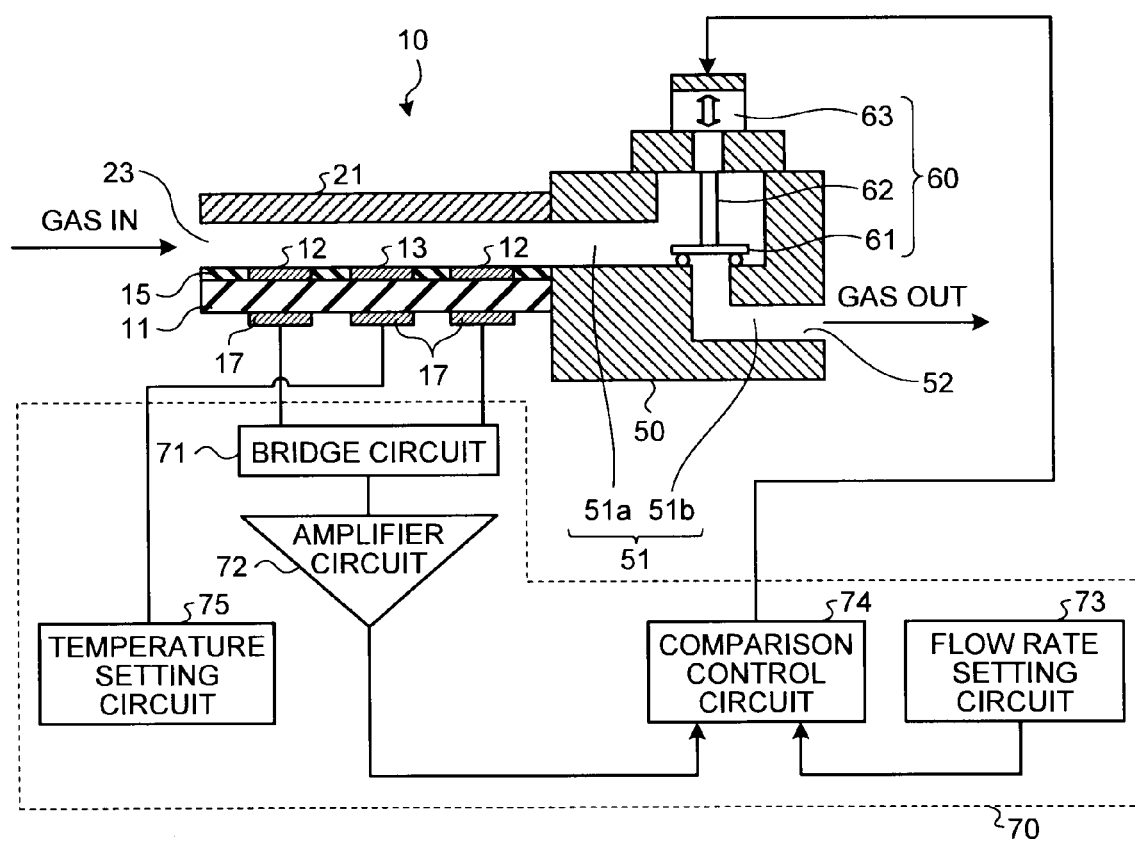
FIG. 1 is a cross sectional view schematically illustrating the configuration of a mass flow controller including a flow sensor according to an embodiment.

FIG. 1 is a cross sectional view schematically illustrating the configuration of a mass flow controller including a flow sensor according to an embodiment. The mass flow controller includes a flow sensor 10, a gas passage forming member 50, a flow rate adjusting unit 60, and a flow rate control unit 70.

Although the detail will be described later, the flow sensor 10 is formed of a thermal mass flowmeter including an MEMS sensor, having a structure in which a passage forming base material 21 is bonded and fixed to a base material 11, and the flow sensor 10 detects the flow rate of a gas carried through a passage 23. A pair of thermosensitive films 12 disposed on the upstream side and the downstream side of the passage 23, a heater film 13 disposed on a position between the pair of the thermosensitive films 12, and a passage protective film 15 are provided on the front surface that is a first main surface of the base material 11. Moreover, on the back surface opposite the front surface of the base material 11, leads 17 are provided, which are individually connected to the thermosensitive films 12 and the heater film 13.

The gas passage forming member 50 has a gas passage 51 that connects the passage 23 to a gas outlet 52 of the flow sensor 10. The gas passage 51 is provided with the flow rate adjusting unit 60 that adjusts the flow rate of a gas carried from the gas outlet 52. The flow rate adjusting unit 60 adjusts the flow rate by opening and closing a valve 61 provided between gas passages 51a and 51b. The opening and closing of the valve 61 are controlled (adjusted) by the amount of movement of an actuator 63 connected through a rod 62.

The flow rate control unit 70 has a bridge circuit 71, an amplifier circuit 72, a flow rate setting circuit 73, a comparison control circuit 74, and a temperature setting circuit 75. The bridge circuit 71 is a circuit that detects a change in a resistance between the two thermosensitive films 12 of the flow sensor 10. The amplifier circuit 72 amplifies a measured flow rate value electrically output by the bridge circuit 71. The flow rate setting circuit 73 sets a preset gas flow rate to the comparison control circuit 74.

The comparison control circuit 74 compares the measured flow rate value from the amplifier circuit 72 with a flow rate set value set by the flow rate setting circuit 73. In the case where there is a difference between the values, the comparison control circuit 74 calculates a set point signal that changes the degree of opening of the flow rate adjusting unit 60 (the position of the valve 61) in a direction in which the difference is canceled (or in such a way that the difference falls in a predetermined range), that is, the comparison control circuit 74 calculates the amount of displacement of the valve 61 to be changed by the actuator 63, and outputs the set point signal to the actuator 63. Moreover, the comparison control circuit 74 stores opening degree adjustment information how much the degree of opening of the flow rate adjusting unit 60 is changed with respect to a difference between the measured flow rate value and the flow rate set value, and outputs the amount of displacement based on the opening degree adjustment information. The temperature setting circuit 75 has a function of heating the heater film 13 in such a way that the temperatures of the pair of the thermosensitive films 12 are higher than the temperature of a measurement subject by a predetermined temperature.

Figure 2A:
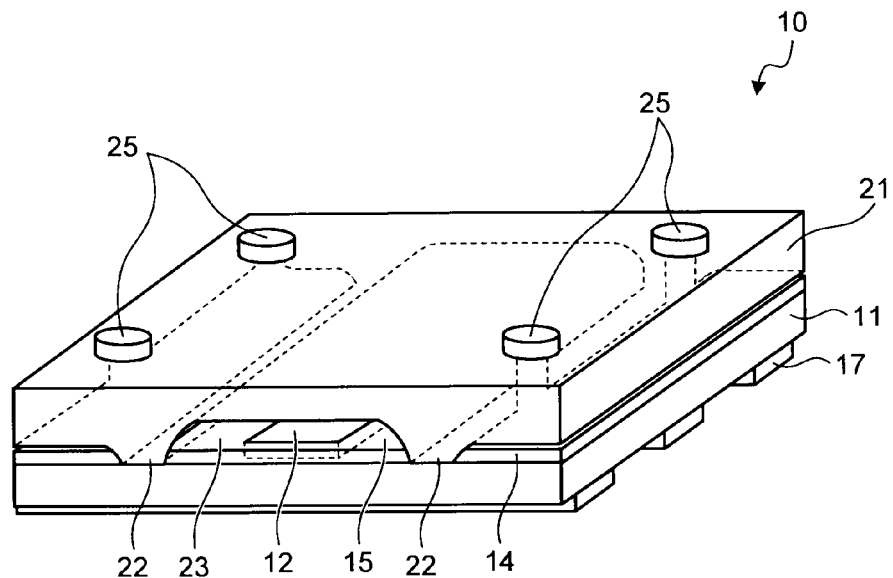
FIGS. 2A and 2B are diagrams illustrating an exemplary configuration of the flow sensor according to an embodiment.
Figure 2B:
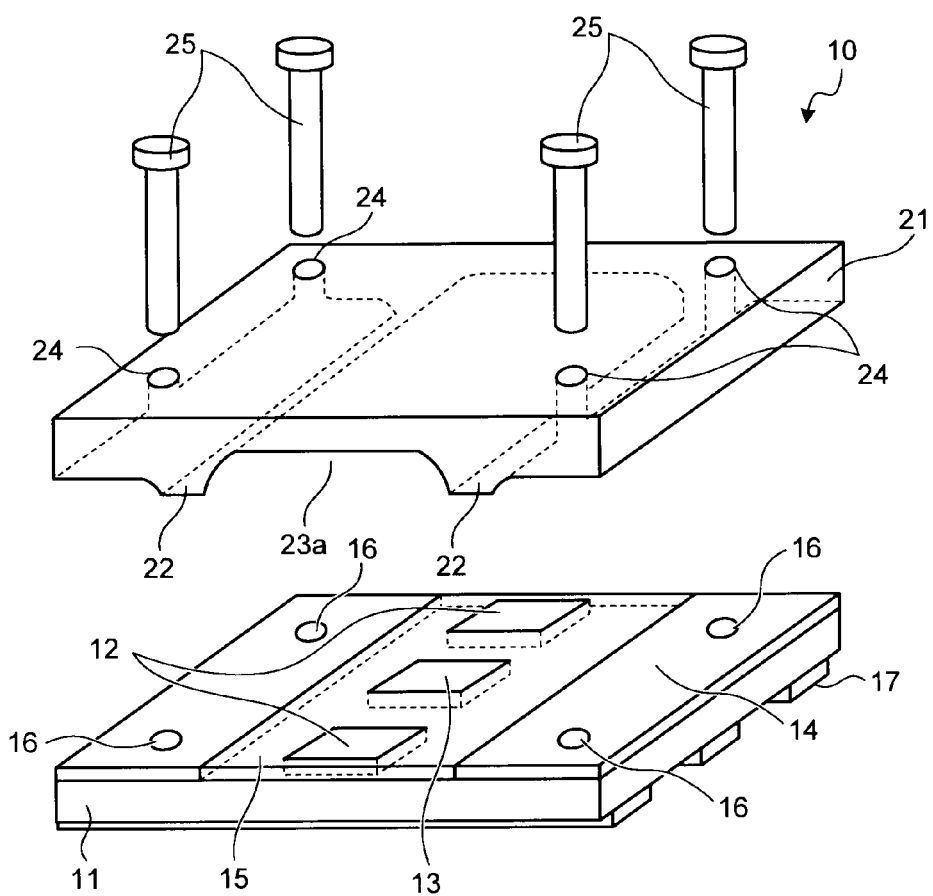

FIGS. 2A and 2B are diagrams illustrating an exemplary configuration of the flow sensor according to this embodiment. FIG. 2A is a perspective view illustrating the structure of the flow sensor, and FIG. 2B is an exploded perspective view schematically illustrating the structure of the flow sensor. As illustrated in the drawings, the flow sensor 10 is formed of the base material 11 on which the thermosensitive films 12 are disposed, the passage forming base material 21, and a fixing member 25 that fixes these materials.

The base material 11 is made of a heat-insulating material such as quartz, glass or polyimide, including the pair of the thermosensitive films 12 disposed upstream and downstream of a region to be the passage 23 on the front surface and the heater film 13 disposed near the center of a distance between the pair of the thermosensitive films 12. The thermosensitive films 12 and the heater film 13 are made of a material such as Pt having resistance against a corrosive gas such as halogen gases, for example.

In the region to be the passage 23 on the front surface of the base material 11, the insulating passage protective film 15 is provided, having resistance against a corrosive gas such as halogen gases. Moreover, in regions other than the region to be the passage 23 on the front surface of the base material 11, a metal sealing film 14 is provided, which is made of Ag or Au or the like having resistance against a corrosive gas.

On the back surface opposite the front surface of the base material 11, the leads 17 are provided, which are connected to the thermosensitive films 12 and the heater film 13 through a contact layer, not illustrated. Here, three leads 17 are disposed, which extend in the lateral direction on the paper surface.

Then, at a predetermined position on the base material 11, a bonding hole 16 is provided for fixing the passage forming base material 21 using the fixing member 25 in such a way that the bonding hole 16 penetrates in the thickness direction. Here, the bonding hole 16 is formed near four corners of the rectangular base material 11.

The passage forming base material 21 is made of stainless steel (SUS306L or the like) or a nickel alloy (Inconel (registered trademark) or the like) with high corrosion resistance, or aluminum having an anodized front surface.

Although the front surface of the passage forming base material 21 is not processed particularly, a groove 23a to be the passage 23 and a side wall forming portion 22 forming the side wall of the passage 23 and sealing a gas carried through the passage 23 in the passage 23 are provided on the back surface (the surface on the opposite side of the front surface of the base material 11) side, which is the second main surface.

The side wall forming portion 22 extends along a direction in which the passage 23 extends, protruding beyond surroundings. Namely, the groove 23a and the regions on the back surface side of the passage forming base material 21 other than the side wall forming portion 22 are formed in such a way that the regions are lower than the side wall forming portion 22. It is noted that in the case where the passage forming base material 21 is made of aluminum, the surface that forms the groove 23a is anodized.

Moreover, at a predetermined position on the passage forming base material 21, a bonding hole 24 is provided for fixing the base material 11 using the fixing member 25 in such a way that the bonding hole 24 penetrates in the thickness direction. Here, the bonding hole 24 is formed near four corners of the rectangular passage forming base material 21 when seen in plane.

The front surface of the base material 11, on which the thermosensitive films 12 and the heater film 13 are formed, is faced to the back surface of the passage forming base material 21, on which the groove 23a is formed, and the front surface and the back surface are aligned with each other in such a way that the passage protective film 15 on the base material 11 is included in the groove 23a on the passage forming base material 21 for fixing the base material 11 to the passage forming base material 21 with the fixing member 25. In this fixing, the side wall forming portion 22 is located on the metal sealing film 14 formed on the outer side of the passage protective film 15 on the base material 11, and compression bonded to the metal sealing film 14 by fixing performed by the fixing member 25. As result, a state across the base material 11 and the passage forming base material 21 is a state in which the base material 11 and the passage forming base material 21 are sealed to each other with metal sealing.

Here, for the passage protective film 15, an alumina film or a film containing yttrium oxide particles (in the following, referred to as an yttria film) having corrosion resistance can be used. In the case of using an yttria film, any films are possible as long as the films are an yttria film. However, in particular, a fine film formed by CVD (Chemical Vapor Deposition) method, aerosol deposition method, impact sintering method, or the like is desirable.

Although the film thickness of the yttria film may be an appropriate thickness (5 µm, for example), preferably, the film thickness ranges from 0.1 µm to 1 µm. Since the coating properties are insufficient if the film thickness is less than 0.1 µm, the effect of providing the yttria film cannot be obtained sufficiently, and the yttria film might rather be a cause of film peeling. The upper limit of the thickness of the yttria film is not restricted particularly. However, an extra effect cannot be obtained if the thickness is too thick, and cracks tend to occur because of accumulation of internal stress, causing a factor of cost increases. Thus, the thickness of the yttria film ranges from 0.1 µm to 1 µm, more preferably, 0.2 to 0.5 µm.

Furthermore, preferably, the film density is 90% or more, more preferably, 95% or more, further preferably, 99% to 100%. If many pores (voids) exist in the yttria film, a halogen gas penetrates through the pores to shorten lifetime. Particularly, it is desirable that fewer pores exist on the front surface of the yttria film.

It is noted that the term "film density" is a term opposite the term "porosity", and the term "a film density of 90% or more" means the same meaning as the term "a porosity of 10% or less". A method for measuring the film density is that an oxide film is cut in the thickness direction, a photograph of the tissue in a 500-fold enlarged cross section is taken with an optical microscope, and the area ratio of pores in the photograph is calculated. Then, the film density is calculated accruing to "the film density (%)=100−the area ratio of pores". For the calculation of the film density, the area of a unit area 200 μm×200 μm is to be analyzed. It is noted that if the film thickness is thin, a plurality of locations are to be measured until the total unit area reaches an area of 200 μm×200 μm.

Moreover, preferably, a surface roughness Ra of the yttria film is 3 μm or less. If irregularities on the front surface of the yttria film are large, it is likely that accuracy in controlling the flow rate is reduced because of passage resistance. The measurement of the surface roughness Ra is to conform to JIS-B-0601-1994. Preferably, the surface roughness Ra is 2 μm or less.

Such an yttria film can be formed using flame spray coating method, CVD method, aerosol deposition method, cold spraying method, gas deposition method, electrostatic powder impact deposition method, impact sintering method, or the like, for example.

In the flow sensor 10 in such a structure, the passage protective film 15 having corrosion resistance is formed on the portion forming the passage 23 on the base material 11, and the thermosensitive films 12, the heater film 13, and the passage forming base material 21 are also made of a material having corrosion resistance. Thus, it is possible to prevent a member forming the passage 23 from being corroded with a corrosive gas such as halogen gases. Moreover, since a pair of the side wall forming portions 22 provided on the passage forming base material 21 are compression bonded to the metal sealing films 14 that sandwich the passage protective film 15 on the base material 11 therebetween, the side wall forming portion 22 and the metal sealing film 14 are sealed with each other. Namely, it is possible to prevent gas leakage from the side portion of the passage 23. Furthermore, since the metal sealing film 14 is made of a metal material such as Ag or Au having corrosion resistance, the metal sealing function will not deteriorate even though a corrosive gas is used for a long time.

Moreover, in the mass flow controller having this flow sensor 10, the flow sensor 10 has resistance against a corrosive gas such as halogen gases and can enclose a corrosive gas, so that it is possible to safely control the flow rate of a corrosive gas.

Figure 3A:
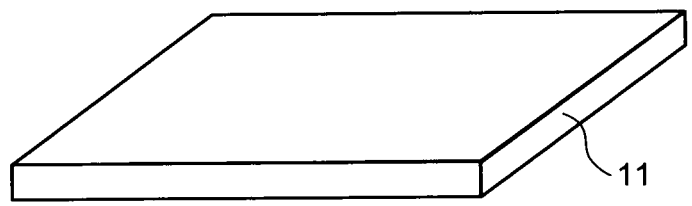
FIGS. 3A to 3K are perspective views schematically illustrating exemplary procedures of a method for manufacturing a flow sensor according to an embodiment.

Next, a method for manufacturing the flow sensor 10 will be described. FIGS. 3A to 3K are perspective views schematically illustrating exemplary procedures of a method for manufacturing a flow sensor according to an embodiment. First, processes on the base material 11 side will be described. As illustrated in FIG. 3A, the base material 11 made of quartz, glass, polyimide, or the like is prepared. The thickness can be 0.5 to 10 mm.

Figure 3B:
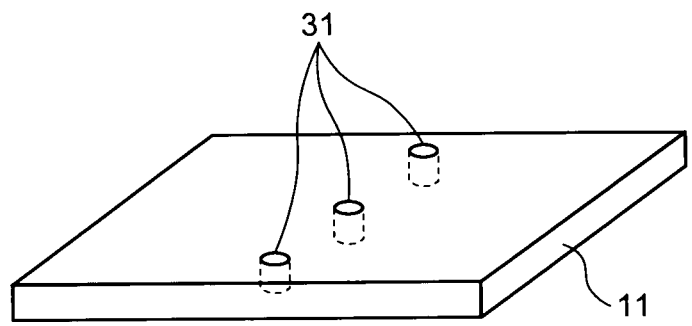

Subsequently, as illustrated in FIG. 3B, a lead hole 31 is formed at the positions of forming the thermosensitive films 12 and the heater film 13 on the front surface of the base material 11, the lead hole 31 forming a contact layer connecting the thermosensitive films 12 and the heater film 13, which are later formed, to the lead 17 on the back surface of the base material 11. The lead hole 31 can be formed by machining or wet etching. In the case of using wet etching, a resist is applied on the front surface of the base material 11, and patterned in such a way that the position at which the lead hole 31 is formed is opened by lithography technique, and the lead hole 31 penetrating in the thickness direction is formed in the base material 11 by wet etching using the patterned resist as a mask.

Figure 3C:
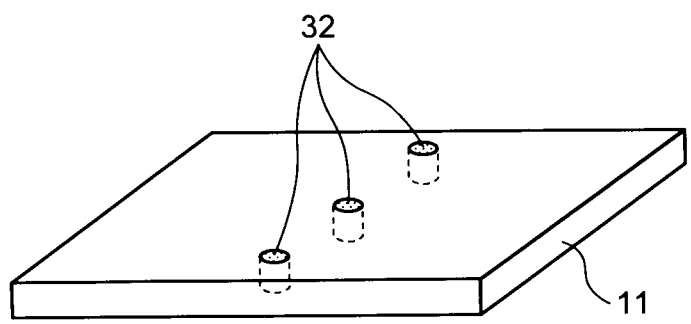

After that, as illustrated in FIG. 3C, a conductive material is embedded in the lead hole 31, and a contact layer 32 is formed. A conductive material is embedded in the lead hole 31 by wire embedding or plating method, for example, and the conductive material formed on the portions other than the lead hole 31 is removed by a method such as CMP (Chemical Mechanical Polishing) or the like, so that the contact layer 32 can be formed. For the contact layer 32, Pt, Cu, Ni, or the like, for example, can be used.

Figure 3D:
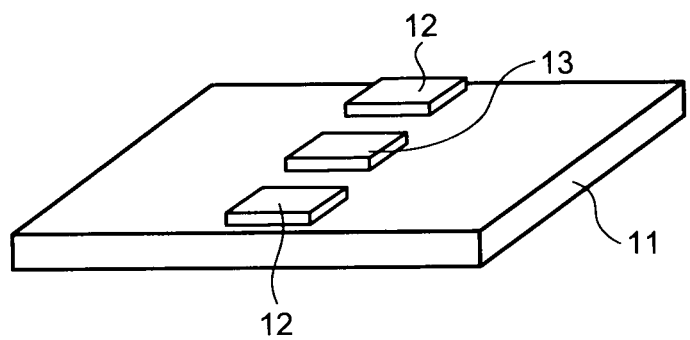

Subsequently, as illustrated in FIG. 3D, at the position of forming the contact layer 32 on one main surface of the base material 11, the thermosensitive films 12 and the heater film 13 are formed. For the thermosensitive films 12 and the heater film 13, Pt, for example, can be used, and for the thicknesses of the thermosensitive films 12 and the heater film 13, the thickness can be a thickness of 1 μm or less, preferably, a thickness ranging from 0.1 to 0.5 μm. The thermosensitive films 12 and the heater film 13 can be formed using pattern compression bonding method, evaporation method, or sputtering method. In pattern compression bonding method, a rectangular Pt foil having a thickness of 1 μm or less is placed on a region including the position of forming the contact layer 32 on the base material 11 through an adhesive layer, and the Pt foil is compression bonded while heated, thereby forming the thermosensitive films 12 and the heater film 13 connected to the contact layer 32. Moreover, in a forming method using evaporation method or sputtering method, a resist is applied on the base material 11, portions at the positions of forming the patterns of the thermosensitive films 12 and the heater film 13 are opened by lithography technique, a Pt film is formed on the base material 11 formed with the resist patterns by evaporation method or sputtering method, and the resist is removed by lift-off, thereby forming the thermosensitive films 12 and the heater film 13 with the Pt film left in the openings of the resist patterns.

Figure 3E:
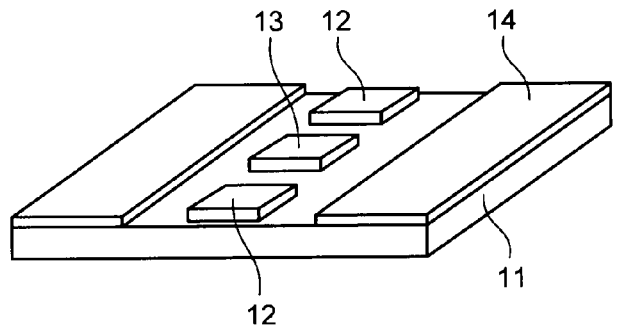

After that, as illustrated in FIG. 3E, the metal sealing film 14 is formed in the regions other than the region to be the passage 23 using printing method, evaporation method, or sputtering method, the metal sealing film 14 having almost the same thickness as the thicknesses of the thermosensitive films 12 and the heater film 13 and being made of a metal material having corrosion resistance. For the metal sealing film 14, Ag or Au, for example, can be used. In printing method, a print mask, which the portion of the passage 23 is masked, is disposed on the front surface of the base material 11 in alignment, and an Ag or Au paste is spread on the base material 11 with a squeegee, the Ag or Au paste is sintered, thereby the metal sealing film 14 is formed. In a method using evaporation method or sputtering method, a resist is applied on the base material 11, portions other than a portion at the position of forming the passage 23 are opened by lithography technique, an Ag or Au film is formed on the base material 11 formed with the resist pattern by evaporation method or sputtering method, and the resist is removed by lift-off, thereby forming the metal sealing film 14 made of the Ag or Au film in regions where the resist pattern is not formed.

Figure 3F:
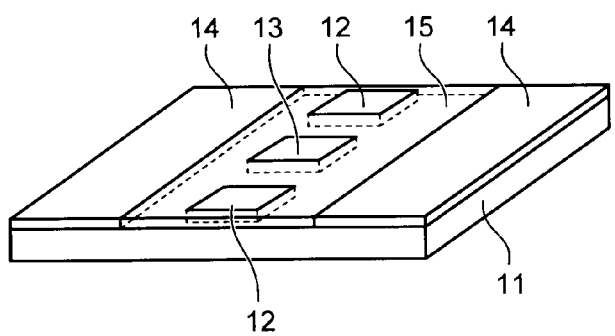

Subsequently, as illustrated in FIG. 3F, the passage protective film 15 having resistance against halogen gases is formed in the regions where the thermosensitive films 12, the heater film 13, and the metal sealing film 14 are not formed on the base material 11, in other words, in the regions where the thermosensitive films 12 and the heater film 13 are not formed in the region to be the passage 23. The passage protective film 15 can be formed in which the regions other than the region to be the passage 23, the thermosensitive films 12, and the heater film 13, for example, are masked with a resist or the like and then subjected to flame spray coating method, sputtering method, evaporation method, or the like. For the passage protective film 15, an alumina film or an yttria film can be used.

Figure 3G:
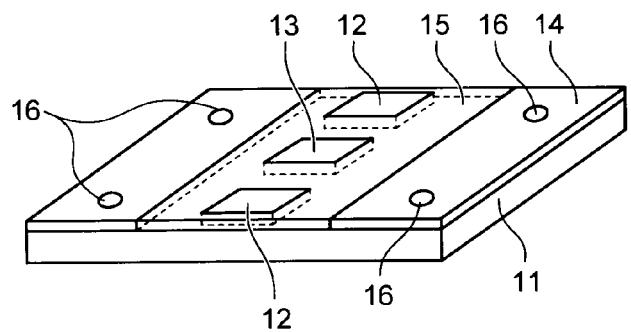

After that, as illustrated in FIG. 3G, the bonding hole 16 is formed at a predetermined position on the base material 11 by machining or wet etching. In the case where the bonding hole 16 is formed by wet etching, a resist is applied on the base material 11, and patterned in such a way that a portion at the position of forming the bonding hole 16 is opened by lithography technique, and the base material 11 is immersed in an etching solution using the patterned resist as a mask for opening the bonding hole 16. Here, the bonding hole 16 is opened at four corners of the rectangular base material 11.

Figure 3H:
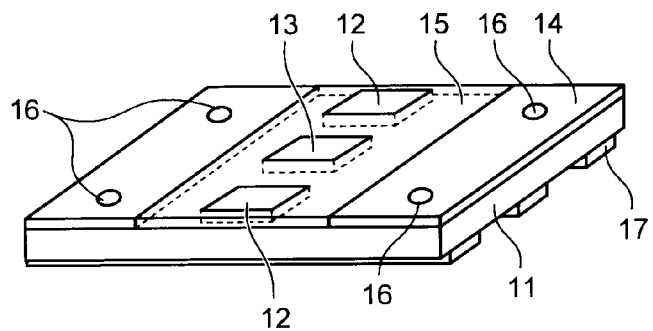

Subsequently, as illustrated in FIG. 3H, the lead 17 is formed on the back surface of the base material 11. The lead 17 can be formed as by forming the lead 17 in a predetermined shape in the region including the position of forming the contact layer 32 on the back surface by printing method, for example, or as by masking a region where the lead 17 is not formed with a resist to form the lead 17 by plating method or sputtering method and then removing the resist by lift-off. As described above, the processes on the base material 11 side are finished.

Figure 3I:
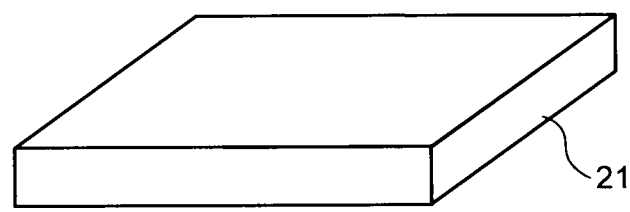

Next, the procedures of processing the passage forming base material 21 will be described. First, as illustrated in FIG. 3I, the passage forming base material 21 is prepared. Although it is desirable that the passage forming base material 21 can be a material having corrosion resistance against halogen gases, a material may be Al if a material is subjected to corrosion resistance treatment after processed. A material having a thickness ranging from 0.1 to a few mm can be used. Here, for convenience of explanation, the size in the direction vertical to the thickness of the passage forming base material 21 is the same as the size in the direction vertical to the thickness of the base material 11.

Figure 3J:
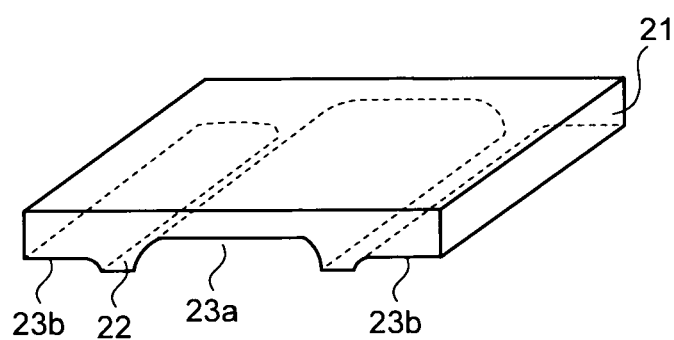

Subsequently, as illustrated in FIG. 3J, the passage 23 and the side wall forming portion 22 for metal sealing are formed on the back surface of the passage forming base material 21 by a method such as machining or wet etching. Here, the groove 23a to be the passage 23 is formed near the center in the lateral direction of the passage forming base material 21, and a step 23b is formed on the back surface of the passage forming base material 21 in such a way that the side walls are provided on both ends of the direction perpendicular to the extending direction of the groove 23a protrude beyond surroundings. Thus, the side wall forming portion 22 is formed.

Figure 3K:
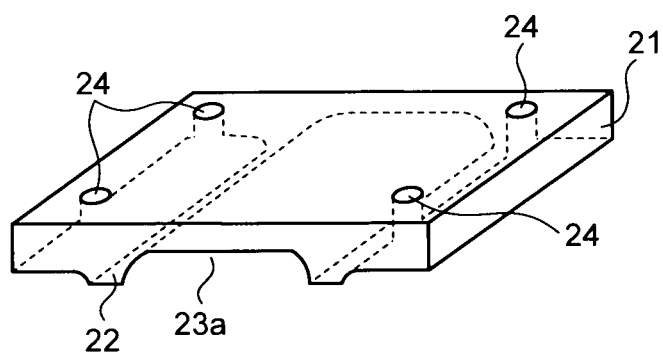

After that, as illustrated in FIG. 3K, the bonding hole 24 is formed at a predetermined position on the passage forming base material 21 by machining or wet etching as similar to the case of the base material 11. Here, the bonding hole 24 is formed at four corners of the rectangular passage forming base material 21. It is noted that in the case where the passage forming base material 21 is made of Al, the passage forming base material 21 is anodized. Moreover, corrosion resistance can be further improved by electrolytic polishing the passage forming base material 21. As described above, the processes of the passage forming base material 21 are finished.

Subsequently, the base material 11 and the passage forming base material 21 are bonded to each other. This is performed as illustrated in FIG. 2B in which the front surface of the base material 11 and the back surface of the passage forming base material 21 are faced and bonded to each other and the fixing member 25 such as a bolt is inserted into the bonding holes 16 and 24 and is tightly fastened by a nut for fixing. In fixing both of the base materials with the fixing member 25, the side wall forming portion 22 of the passage forming base material 21 protruding beyond the other regions is compression bonded to the metal sealing film 14 on the base material 11, serving as metal sealing. As a result, the flow sensor 10 as illustrated in FIG. 2A can be obtained. It is noted that in the description above, the explanation is given in which the processes of the base material 11 are explained and then the processes of the passage forming base material 21 are explained. However, the order of the processes of the base material 11 and the processes of the passage forming base material 21 is not restricted particularly; any process may be performed first, or the processes may be performed at the same time.

FIG. 4 is a cross sectional view schematically illustrating another exemplary configuration of a mass flow controller according to an embodiment. This mass flow controller is used in the case where the amount of a gas whose flow rate is controlled is larger than that in the case illustrated in FIG. 1.

The mass flow controller includes the flow sensor 10, a gas passage forming member 50, a flow rate adjusting unit 60, and a flow rate control unit 70. The gas passage forming member 50 has a gas inlet 53, a gas outlet 52, and a gas passage 51 between the gas inlet 53 and the gas outlet 52. In the gas passage 51, the aforementioned flow sensor 10 is provided on a bypass 51d branched from a mainstream portion 51c, and the flow rate adjusting unit 60 is provided on the downstream side of the joined gas passage 51a. It is noted that the same components as those in FIG. 1 are designated the same reference numerals and signs for omitting the explanation.

As described above, in the flow sensor 10 according to an embodiment, there are included the base material 11, in which the passage protective film 15 made of a material having corrosion resistance is formed in the region to be the passage 23, the thermosensitive films 12 and the heater film 13 are disposed in the region, and the metal sealing film 14 is formed in the regions other than the passage 23, and the passage forming base material 21 made of a material having corrosion resistance, in which the portion to be the passage 23 is formed of the groove 23a and the side wall forming portion 22 protruding beyond the surroundings is formed along in the longitudinal direction. The base material 11 and the passage forming base material 21 were fixed to each other with the fixing member 25 in such a way that the side wall forming portion 22 presses the metal sealing film 14 on both sides sandwiching the passage protective film 15 therebetween. Thus, the flow sensor 10 has resistance against a corrosive gas, and the side wall forming portion 22 is brought intimate contact with the passage protective film 15 to function as metal sealing, so that the flow sensor 10 has the advantage that a corrosive gas can be enclosed in the passage 23. Moreover, the flow sensor 10 has the advantages that a corrosive gas can be prevented from leaking and the safety of the flow sensor 10 and the mass flow controller can be enhanced. Furthermore, the flow sensor 10 can be manufactured by the similar processes as the fabrication processes for semiconductor devices. Thus, the flow sensor 10 also has the advantages that mass production can be performed, and as a result, the manufacture costs of the flow sensor 10 can be reduced.

In addition, the mass flow controller having this flow sensor 10 has the advantage that the flow rate can be controlled more highly accurately at higher response speed as compared with a mass flow controller with a coil sensor.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A flow sensor comprising:
   a first substrate having a pair of thermosensitive films, a heater film located on a position between the pair of thermosensitive films, and a passage protective film having corrosion resistance and provided at a position other than positions of forming the thermosensitive films and the heater film in a passage forming region on a first main surface, the first substrate having a metal sealing film having corrosion resistance and provided in a region other than the passage forming region on the first main surface; and
   a second substrate having a groove formed in the passage forming region on a second main surface disposed opposite the first main surface and a side wall forming portion separating other regions other than the passage forming region from the groove and provided as protruding beyond the other regions, the second substrate being made of a material having corrosion resistance; and
   a fixing member configured to bond the first main surface to the second main surface so that the first main surface is faced to the second main surface and fix the first main surface to the second main surface,
   wherein the side wall forming portion of the second substrate is compression bonded so that the side wall forming portion is located on the metal sealing film of the first substrate.

2. The flow sensor according to claim 1, wherein the passage protective film is an alumina film or an yttria film.

3. The flow sensor according to claim 1, wherein the passage protective film is an yttria film having a thickness ranging from 0.1 µm to 1 µm.

4. The flow sensor according to claim 1, wherein:
   the first substrate is made of a material having a heat-insulating property; and
   the second substrate is made of a material having corrosion resistance.

5. The flow sensor according to claim 4, wherein:
   the first substrate is quartz, glass or polyimide; and
   the second substrate is stainless steel or a nickel alloy, having corrosion resistance, or aluminum having an anodized surface.

6. The flow sensor according to claim 1, wherein:
   the thermosensitive film and the heater film are made of Pt; and
   the metal sealing film is made of Ag or Au.

7. A mass flow controller comprising:
   a gas passage forming member forming a gas passage;
   a flow rate adjusting unit disposed in the gas passage and having a valve configured to adjust a flow rate of a gas and an actuator configured to adjust a degree of opening of the valve;
   the flow sensor according to claim 1 configured to detect a measured flow rate value that is a flow rate of a gas carried through the gas passage; and
   a flow rate control unit configured to control the flow rate adjusting unit so that the measured flow rate value detected by the flow sensor becomes a flow rate set value that is a flow rate carried in the gas passage.

8. The mass flow controller according to claim 7, wherein:
   the gas passage forming member is formed to have a mainstream portion and a bypass that is branched from the mainstream portion and again joined to the mainstream portion; and
   the flow sensor is provided on the bypass.

* * * * *